(12) United States Patent
Cullen

(10) Patent No.: US 6,970,108 B1
(45) Date of Patent: Nov. 29, 2005

(54) ENCODER INTERFACE

(76) Inventor: Christopher P. Cullen, 21 Arrowhead Trail, Ipswich, MA (US) 01938

(*) Notice: Subject to any disclaimer, the term of this patent is extended or adjusted under 35 U.S.C. 154(b) by 0 days.

(21) Appl. No.: 10/863,799

(22) Filed: Jun. 8, 2004

(51) Int. Cl.[7] ............................................. H03M 1/22
(52) U.S. Cl. ...................................................... 341/11
(58) Field of Search ......................... 341/1, 11, 12, 13, 341/14, 15; 714/795, 796, 797; 250/271, 250/272, 231.12, 231.13, 231.16, 231.14; 324/207.13; 356/614, 617

(56) References Cited

U.S. PATENT DOCUMENTS

| | | | |
|---|---|---|---|
| 4,079,251 A | * | 3/1978 | Osann, Jr. .............. 250/231.16 |
| 4,486,845 A | * | 12/1984 | Duckworth ................. 702/151 |
| 4,558,304 A | * | 12/1985 | Wand ......................... 341/115 |
| 4,914,437 A | * | 4/1990 | Kibrick et al. ................. 341/3 |
| 5,021,781 A | * | 6/1991 | Salazar et al. ................ 341/13 |
| 5,491,391 A | * | 2/1996 | Bahr et al. ..................... 318/39 |
| 5,594,241 A | | 1/1997 | Li et al. |
| 5,939,712 A | * | 8/1999 | Venugopal et al. .... 250/231.13 |
| 6,555,809 B2 | * | 4/2003 | Kenjo et al. ........... 250/231.14 |
| 6,683,543 B1 | * | 1/2004 | Yeo ............................. 341/13 |

FOREIGN PATENT DOCUMENTS

JP 408233604 A * 9/1996 .......... G10D 5/244

OTHER PUBLICATIONS

IBM NN8706122 Incremental Counter, Jun. 1, 1987.*
Specification Sheet for Texas Instruments, TMS320C242 DSP Controller, Sep. 2000.
Specification Sheet for National Semiconductor, LM628/LM629, Precision Motion Controller, Nov. 1999.
Specification Sheet for Analog Devices, Single-Chip, DSP-Based High Performance Motor Controller ADMC401, 2000, no month.
Specification Sheet for PMD, Inc., Advanced Multi-Axis Motion Control Chipset, Nov. 1997.

* cited by examiner

*Primary Examiner*—Brian Young
(74) *Attorney, Agent, or Firm*—Fish & Richardson P.C.

(57) ABSTRACT

An encoder interface device that permits automatic discovery of an unknown encoder that is physically connected to the interface device, so as to enable correct operation. The device permits discovery of characteristics of an unknown encoder including the primary quadrature A and B channels, the index channel, and the active state of the index channel. Once discovered and configured, the device indicates the index position of the encoder with an accuracy of a single encoder count. The device also supports "wide" index pulses, in which the index channel is active for more than seven consecutive encoder counts. The device also provides for the discovery, configuration, and position latching with single-encoder-count accuracy for encoders having index pulses of almost arbitrary width.

58 Claims, 8 Drawing Sheets

ENCODER INTERFACE

TECHNICAL FIELD

This disclosure relates to incremental position-sensing encoders and interface devices for such encoders.

BACKGROUND

Incremental encoders are widely used in position-controlled motion to provide the position of a motor or moving element to a controller.

An incremental encoder includes two channels that provide continuous position information about the encoder as it is moved. For purposes of this disclosure these two channels are defined as the A and B channels. In a digital encoder, the A and B channels are digital channels that each produce a square wave. The two square waves are in quadrature (i.e., phase shifted 90 degrees) with each other and provide directional information about the encoder. As a moving element in the encoder moves, the square waveforms on the A and B channel transition between a high and low state, which provides data about the position and direction of the encoder. In an analog encoder, the A and B channels are analog channels that each produce a repeating waveform, for example, a sinusoid. The two waveforms are in quadrature with each other and provide information about the position and direction of the encoder.

An encoder interface is often used with or incorporated into a motion controller to convert information contained in the waveforms in the A and B channels into a form that indicates position of the moving element. More particularly, a position counter is often included in an encoder interface device adapted for digital A and B channels to count transitions on each channel; the quadrature relationship of the channels provides direction information so that the position counter will count upwards if motion is in a first direction, and downwards if motion is in a second direction. Similarly, a position counter is often included in an encoder interface device adapted for analog A and B channels, to count waveform cycles and may also count fractions of a waveform cycle by measuring the voltage level on each channel and computing a function of voltage level indicating position within the waveform cycle. The value of the position counter therefore indicates a position of the encoder (and motor or other element attached to the encoder).

An encoder interface, typically a digital semiconductor device, is often used with or incorporated into a motion controller. The encoder interface has a position counter to maintain a count of the number of transitions, which serves as an indication of the moving element's position.

While the A and B channels provide information about the movement and direction of the motor, they do not provide information about the absolute position of the motor. For this reason, an additional digital channel, called the index channel (referred to as the Z channel in this document) is often provided with encoders. The index channel provides a pulse once per revolution for rotary encoders, and once every chosen linear distance for linear encoders. Thus, when a pulse is sensed in the Z channel, a controller knows that the motor is at a unique position within a certain interval of distance. The controller can use this information to determine proper motor commutation settings, check the consistency of the distance measured between index pulses, and also determine a unique reference position within the moving element's entire range of motion.

It is desirable to know the index position (i.e., the value of the encoder interface position counter when the index pulse is active) to an accuracy of a single encoder count, which is simple if the index pulse is active for only a single encoder count. However, achieving an index pulse that is active for a single encoder count can be difficult in high-resolution encoders, where there may be thousands of encoder counts per revolution or per centimeter.

SUMMARY

In one aspect the invention features a method for discovering characteristics of an unknown incremental encoder by monitoring some or all of the encoder channels (i.e., the A, B and/or index channels) with an encoder interface device to detect state changes on the encoder channels as an encoder is moved. By monitoring state changes that occur on the encoder channels, several characteristics of the encoder may be discovered, including identification of the index channel of the incremental encoder, identification of the active state of the index channel of the incremental encoder, selection of a combined state of the A and B channels as an index position, and the width of the index pulse. Discovering characteristics of an unknown encoder advantageously permits a controller or other device to configure an encoder interface device for operation with the encoder with little or no user intervention.

In another aspect, the invention features a method for discovering the index channel of an unknown incremental encoder having three channels including an A channel, a B channel, and an index channel. The method includes monitoring some or all of the connected channels with an encoder interface device to detect a number of transitions that occur on at least two of the channels as the encoder is moved and identifying which of the three channels is the index channel of the encoder based on the number of transitions detected by the encoder interface device.

In some configurations, the step of identifying which of the three channels is the index channel includes identifying which of the channels had the smallest number of transitions detected as the encoder was moved. Monitoring the channels to detect transitions may involve simply counting transitions (i.e., state changes) that occur on the monitored channels without regard to direction of encoder travel or may involve counting transitions with regard to direction of encoder travel (i.e., recording encoder counts). Transitions/encoder counts detected on the monitored channels may be recorded in a register associated with each of the monitored channels.

In some configurations, two of the three encoder channels are monitored to detect transitions and the index channel is selected based on the number of transitions detected on the two channels. For example, if approximately the same number of transitions are detected on the two monitored channels, then the non-monitored channel is identified as the index channel since the index channel has far fewer transitions that occur as an encoder is moved as compared to the A and B channel. Similarly, if a relatively small number of transitions is detected on one of the two monitored channels, then the channel having the relatively small number of transitions is identified as the index channel. The input terminals to the encoder interface device may be configurable to allow the encoder interface device, controller or other device to associate a terminal with the identified index channel, and to associate other terminals with the A and B channels.

In another aspect, the invention features a method for discovering the active state of the index channel of an incremental encoder that includes monitoring some or all of the channels with an encoder interface device to determine a distance traveled by the incremental encoder during a first state of the index channel as the encoder is moved. From this determined distance, the active state of the index channel may be determined.

In some configurations, the method also includes monitoring the encoder channels to determine a distance traveled by the encoder in the second state of the index channel as the encoder is moved. In this case, determining which of the first or second state of the index channel is an active may also be based on the distance traveled by the encoder in the second state.

In some configurations, monitoring the encoder channels to determine a distance traveled by the encoder includes recording in a register on the encoder interface device the number of encoder counts sensed on the A and B channels of the encoder while the index channel is in its first and/or second state as the encoder is moved. Determination of which of the states of index channel is the active state may include selecting the active state as the state in which the encoder traveled the smallest distance as the encoder is moved the distance.

In some configurations, the encoder interface device is configurable to permit one or more bits to be set in a configuration register that indicates the determined active state of the index channel.

In another aspect, the invention features a method for selecting an index latch state for an unknown encoder that includes connecting the encoder channels to an encoder interface device, moving the encoder over a distance sufficient to cause generation of at least one index pulse, monitoring the channels as the encoder is moved to detect one or more combined states of the A and B channels occurring while the index channel is in an active state, and selecting one of the determined combined states of the A and B channels as an index latch state.

In some configurations, selection of one of the combined states of the A and B channels as the index latch states includes selecting a combined state of the A and B channels other than a first and a last combined state of the A and B channels detected during the index active state pulse.

In some configurations, the method further includes determining if the index active state pulse is a wide index pulse, that is each combined A/B state detected during the index pulse was detected at least twice. In these configurations, the encoder interface device may be configured (e.g., by setting a bit in a configuration register) to indicate a wide index pulse.

In another aspect, the invention features a method for determining an index position of an incremental encoder configured to produce a wide index pulse that includes sensing when the index channel enters an active state, recording a first encoder position when a predetermined combined state of the A and B channels is detected after the index pulse enters the active state, recording a second encoder position when the predetermined combined state of the A and B channels is detected for a second time after the index pulse enters the active state, and selecting the first or second recorded position as the index position based on the direction of encoder travel.

In some configurations, the first recorded position is the position of the encoder when a predetermined combined state of the A and B channels is sensed for a first time after the index pulse enters the active state, and the second recorded position is the encoder position each time a predetermined combined state of the A and B channels is sensed while the index pulse is in the active state. The method may also include recording the distance (e.g., by recording encoder counts) traveled by the encoder while the index pulse is active and using the distance traveled by the encoder to determine a direction of encoder travel (e.g., a positive encoder count value means travel in one direction, a negative encoder count value means travel in the opposite direction).

Some configurations verify that the encoder did not change directions during the index active state by comparing the recorded distance traveled during the index active pulse with a predetermined distance. If the recorded distance is less than the predetermined amount, then this indicates that the encoder did change directions during the index pulse and an index position may not be recorded.

Other aspects of the invention include an encoder interface device, controller or other apparatus configured to discover characteristics (e.g., identification of an index channel, identification of the active state of the index channel, selection of an index latch state, etc.) and/or determining an index position of an encoder having a wide index pulse.

One advantage of an encoder interface device designed according to the teachings set forth below is the ability to latch an index position value that is repeatable to a single encoder count even in the case of an encoder having a wide index pulse (i.e., an index pulse which is as wide or wider than two complete cycles of the A or B channel).

Another benefit provided by an interface designed according to the teachings set forth below is to automatically discover the connections between the encoder and interface. Often encoders are wired manually and the connections are subject to human error. Occasionally the channels are not properly identified. An encoder interface device can be provided with facilities to capture state and timing information that allow a motion controller to determine which channels are A/B, and which are Z; whether the active state of the index channel is high or low; how wide the index pulse is, and how to configure index pulse capture to get single-encoder-count repeatability in index position.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
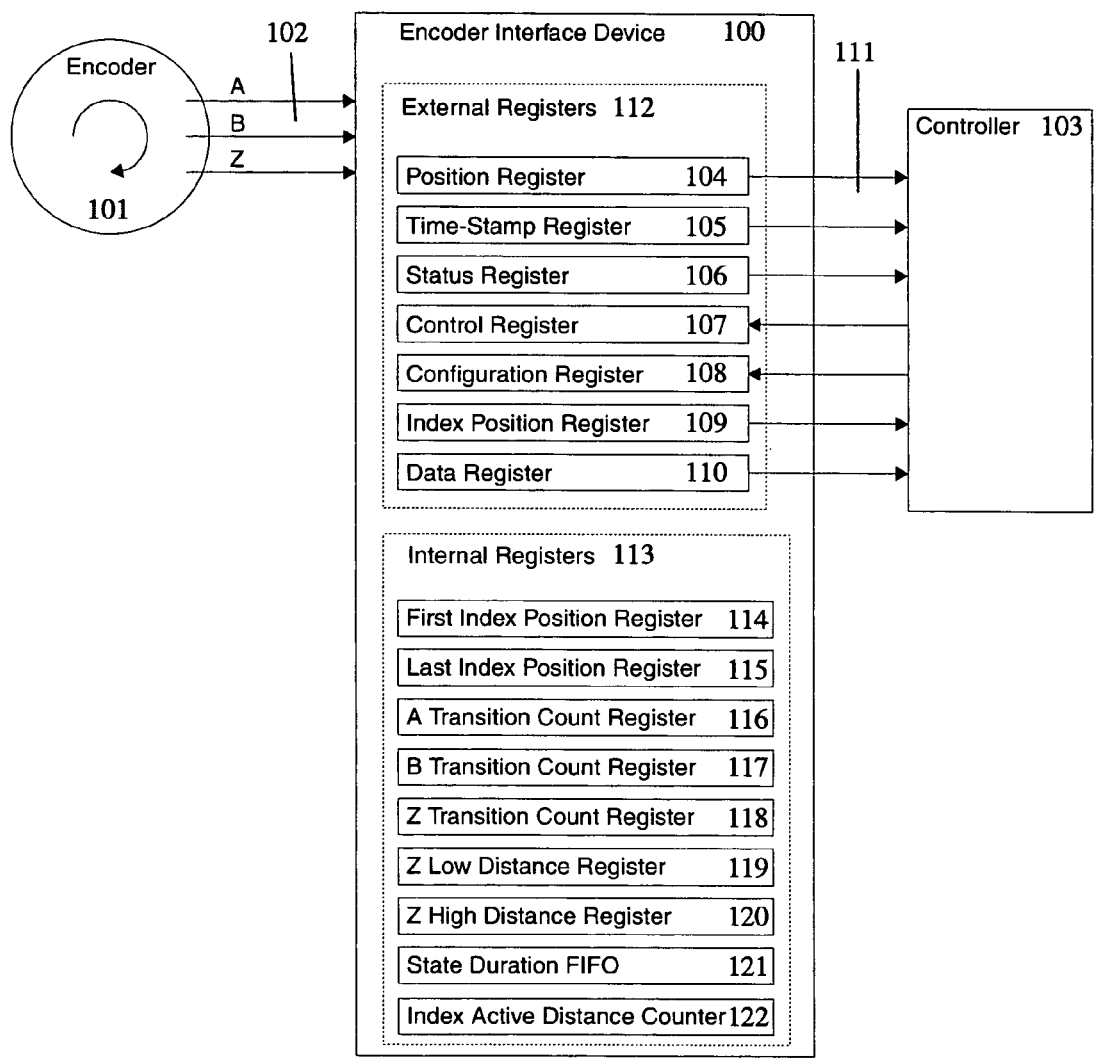
FIG. 1. is a block diagram of the logical components of an encoder interface device.

As shown in FIG. 1, an encoder interface device 100 is electrically coupled to an encoder 101 via signal path 102, and communicates with a controller 103 via signal path 111. The signal path 102 includes three digital signal channels, A channel, B channel, and Z channel. The controller 103 is configured to read data from, and/or write data to the external registers 112 within the encoder interface device 100. The external registers in this particular implementation include a position register 104, time-stamp register 105, status register 106, control register 107, configuration register 108, index position register 109, and data register 110. The function and operation of these registers will be described in more detail below.

In addition to the external registers, the encoder interface device 100 also includes several internal registers 113, which are not directly accessible by the controller. These registers include first and last index position registers 114 and 115 respectively, transition count registers for the A, B, and Z channels 116, 117, and 118 respectively, a Z low-state distance register 119, a Z high-state distance register 120, a state-duration FIFO buffer 121, and an index active distance counter 122. As will be explained in more detail below, these internal registers are used to facilitate index position capture for a wide index pulse, and encoder channel discovery.

The A, B, and Z channels in the encoder signal path 102 may be composed of single wires or differential pairs. Each of the channels propagate a digital signal, which has a value that is either electrically high or low at any given time. By convention, a high signal is assigned the numeric value 1 (one) and a low signal the value 0 (zero).

The communication signal path 111 may be any known signal path used to connect a controller (e.g., a microprocessor or digital signal processor) with another device, such as parallel (bus) connections (e.g., a Peripheral Component Interconnect (PCI) bus or an Industry Standard Architecture (ISA) bus) or serial connections (e.g., a Serial Peripheral Interface (SPI or a Low Voltage Differential Signaling (LVDS) connection).

The encoder interface device 100 may be implemented using a Field-Programmable Gate Array (FPGA), custom semiconductor device (e.g., an Application-Specific Integrated Circuit (ASIC), or other known electronic devices. Alternatively, the encoder interface device 100 may be a module embedded in a larger electronic device such as a dedicated motor controller device.

Figure 2A:
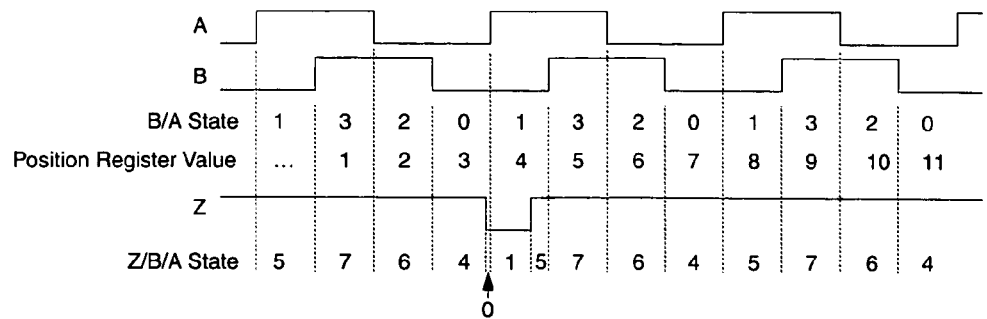
FIG. 2A. is a graph illustrating the state of encoder channels for an index pulse that is one encoder count wide.
Figure 2B:
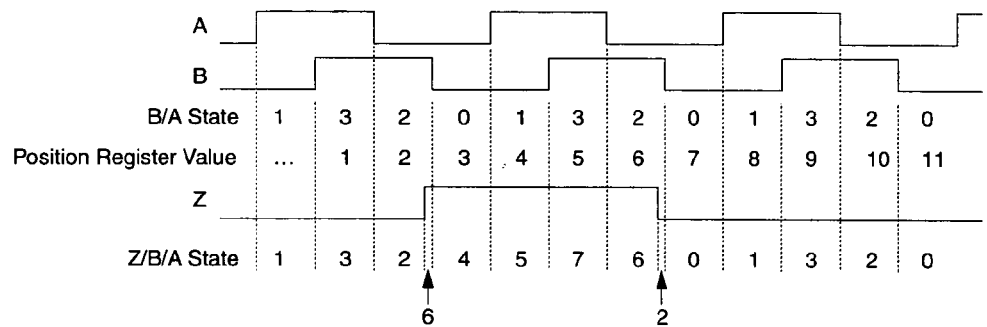
FIG. 2B. is a graph illustrating the state of encoder channels for an index pulse that is four encoder counts wide.
Figure 2C:
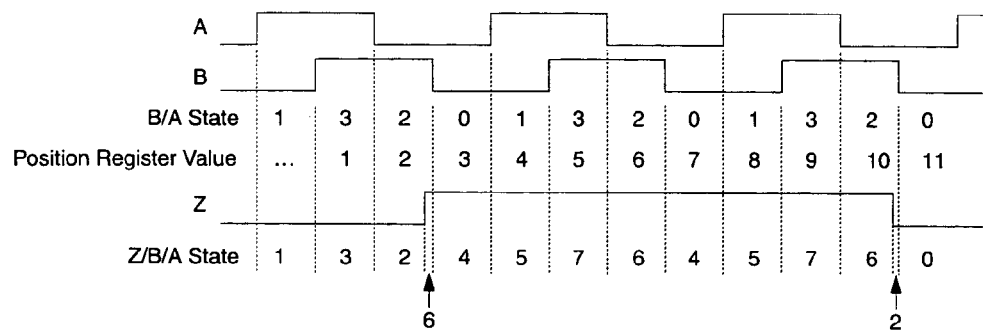
FIG. 2C. is a graph illustrating the state of encoder channels for an index pulse that is eight encoder counts wide.

FIGS. 2A–2C illustrate the state of the A, B, and Z channels sensed by an encoder interface device 100 (shown in FIG. 1) connected to three different encoders. Each of the three encoders shown in FIGS. 2A–2C are identical except they produce an index pulse of differing widths.

In this example, the A channel of each encoder propagates a square wave having a 50% duty cycle versus distance traveled. The B channel of each encoder propagates a square wave that is identical to the one produced in the A channel except that it is 90 degrees out of phase with the A channel, i.e. each transition on the A channel occurs halfway between transitions on the B channel, and each transition on the B channel occurs halfway between transitions on the A channel.

This arrangement of the signals propagated in the A and B channels, known as "quadrature", produces four unique states for each full cycle of the A or B channel. The numeric values of the state of the A and B channel can be combined to form a two-bit-wide number (taking values from zero to three) shown in Table 1 representing the combined state of the A and B channels (e.g. B/A state in FIG. 2A).

TABLE 1

| B Channel State | A Channel State | B/A State decimal [binary] |
| --- | --- | --- |
| 0 | 0 | 0 [00] |
| 0 | 1 | 1 [01] |
| 1 | 0 | 2 [10] |
| 1 | 1 | 3 [11] |

When the encoder interface device senses a change of state in either the A or B channel, the encoder interface device 100 increments or decrements the position register 104. The encoder interface device 100 determines whether to increment or decrement the position register 104 by decoding the sequence of B/A states. For example, the encoder interface may be configured such that B/A state changes from 0 to 1, 1 to 3, 3 to 2, or 2 to 0, mean that the moving element is traveling in a positive direction (e.g., clockwise) and each such change results in the position register 104 being incremented by one. Similarly, the encoder interface would be configured such that B/A state changes from 0 to 2, 2 to 3, 3 to 1, or 1 to 0, means that the moving element is traveling in a negative direction (e.g., counter-clockwise), and each such change results in the position register 104 being decremented by one. Each increment or decrement in the position register is referred to in this document as an "encoder count". An encoder count is thus used by the controller 103 as a unit of linear or rotary distance measurement.

In addition to capturing encoder counts, the encoder interface device 100 also captures the time of each B/A state change in the time-stamp register 105. Time data is preferably generated from a high-resolution timer/counter included within the encoder interface device 100. By recording the time of each B/A state change, a controller is able not only to determine the position of the moving element, but also, for example, to estimate velocity of the moving element or derive the acceleration of the moving element with higher accuracy than would be possible using position information alone.

As previously mentioned, encoders typically propagate an index pulse on a Z channel when the moving element passes a particular location (e.g., at 126.3 degrees within each 360 degree revolution, at 5 centimeters and each 10.5 centimeters thereafter of linear travel, or at 25 and 105 millimeters of travel within a range of linear motion).

Note that the electrical level of an index pulse may be either high or low (one or zero) during its active state (i.e. the state in which the pulse indicates the occurrence of the marked or "indexed" position). For example, as shown in FIGS. 2B and 2C the index pulse is active when the Z channel is at a high electrical level, whereas in FIG. 2A the index pulse is active when the Z channel is at a low electrical level. The active state of the index pulse is determined by the encoder as well as by the way the wires comprising the Z channel are connected to the encoder interface device 100. For example, if a differential pair of wires is used to transmit the Z channel signal, the active state can be reversed by exchanging the connection of the two wires in the pair, i.e. connecting the Z+ wire to the Z− input and the Z− wire to the Z+ input.

Because the index pulse provides a marker for the absolute position of the moving element, it is desirable that the encoder interface record an index position that corresponds to the same position each time an index pulse is sensed. Indeed, some controllers often use the index position to check the integrity of the position signal by verifying the distance measured between index positions (this distance is called the "index period"). If the index period changes, a controller may indicate that the encoder readings are not necessarily accurate, and in some cases, cause the system to cease operation. It is therefore often important that variations in the index period not occur spuriously because of non-repeatability in the index position.

However, an index pulse may be wider than the width of a single encoder count, which means that there will be multiple position readings (i.e., multiple different values stored in the position register) during the time when the index pulse is active. For example, the encoder shown in FIG. 2B produces an index pulse that is approximately four encoder counts wide, spanning B/A states 2, 0, 1, 3, and 2, which means that there are five possible position readings (i.e., 2 through 6) to take as the index position while the index pulse is active. Similarly, the encoder shown in FIG. 2C produces an index pulse that is eight encoder counts wide, spanning B/A states 2, 0, 1, 3, 2, 0, 1, 3, and 2, which means that there are nine possible position readings (i.e., 2 through 10) to take as the index position while the index pulse is active. Additionally, transitions on the index channel will not necessarily align with transitions on the A and B channels. For example, while the encoder in FIG. 2A produces an index pulse that is approximately one encoder count wide, the index pulse begins in B/A state 0 and continues into B/A state 1, making two possible position readings (i.e., 3 and 4) to take as the index position while the index pulse is active. As will be explained in more detail below, the encoder interface device 100 is configured to track the states of the A, B, and Z channels to ensure that the same position reading is recorded as the absolute position each time an index pulse is generated and regardless of the length or polarity of the index pulse.

The Z channel has two states, which can be represented by the numerical value of one for a high electrical level and zero for a low level. The numeric value representing the state of the Z channel can be combined with numeric values representing the states of the A and B channels to form a 3-bit number shown in Table 2 that represents the combined state of all three channels.

TABLE 2

| Z Channel State | B Channel State | A Channel State | Z/B/A State decimal [binary] |
| --- | --- | --- | --- |
| 0 | 0 | 0 | 0 [000] |
| 0 | 0 | 1 | 1 [001] |
| 0 | 1 | 0 | 2 [010] |
| 0 | 1 | 1 | 3 [011] |
| 1 | 0 | 0 | 4 [100] |
| 1 | 0 | 1 | 5 [101] |
| 1 | 1 | 0 | 6 [110] |
| 1 | 1 | 1 | 7 [111] |

As will be explained in more detail below, the controller 103 is configured to use the encoder interface device 100 to determine both the Z channel active state (i.e., whether the Z channel is active at a high or low state) as well as the possible index latch states (i.e., the B/A states when the index pulse is active) for a particular encoder. The controller 103 also is configured to select a particular Z/B/A state as the index latch state depending on the Z channel active state and the B/A states that occur when the Z state is active. The index latch state is written by the controller to the configuration register 108 of the encoder interface device.

Whenever this index latch state is observed on the three channels, the current encoder position is latched by the encoder interface device 100, meaning that the contents of the position register 104 are copied to the index position register 109. The latched position is called the index position. The encoder interface device 100 is also configured to set a bit (change its value to one), called the new index position status bit, in the status register 106 to indicate that the index pulse was observed. By reading the index position register 109, or by other means such as writing a bit in the control register 107, the controller 103 causes the new index position status bit to be cleared (value changed to zero).

For example, when the encoder interface device 100 is connected to the encoder shown in FIG. 2B, the controller 103 uses the encoder interface device 100 to determine that the active Z channel state is 1 (electrical high level). The controller is also able to determine that B/A states 0, 1, and 3 occur only once, and B/A state 2 occurs twice, when the Z channel is in the active state. In order to ensure single-encoder-count repeatability of the index position, the controller 103 sets the Z/B/A latch state to either 4, 5, or 7.

Similarly, when the encoder interface device 100 is connected to the encoder shown in FIG. 2A, the controller 103 uses the encoder interface device 100 to determine that the active Z channel state is 0 (electrical low level). The controller is able to determine that B/A states 0 and 1 occur once during the Z channel active state, and therefore chooses between Z/B/A latch state of 0 or 1. The controller 103 uses the encoder interface device 100 to determine that the duration of Z/B/A state 1 is longer than the duration of state 0, which is so short that its occurrence might not be reliable or repeatable. Therefore the Z/B/A latch state of 1 is set as the index latch state by the controller.

As shown in FIG. 2C, if an index pulse is wider than seven encoder counts, the index position cannot be latched reliably to single-encoder-count repeatability using the method of the Z/B/A latch state described above. This is because each latch state occurs more than once during the active index state. For example, the index pulse in FIG. 2C spans each of the four B/A states at least twice. (An index pulse in which each of the latch states occurs more than once is referred to as a wide index pulse in this document.) As will be explained in more detail below, the encoder interface device 100 is configured to track the occurrences of a selected latch state during a wide index pulse and select the first occurring or last occurring latch state based on the direction of motion.

Encoder Channel Discovery

Figure 3:
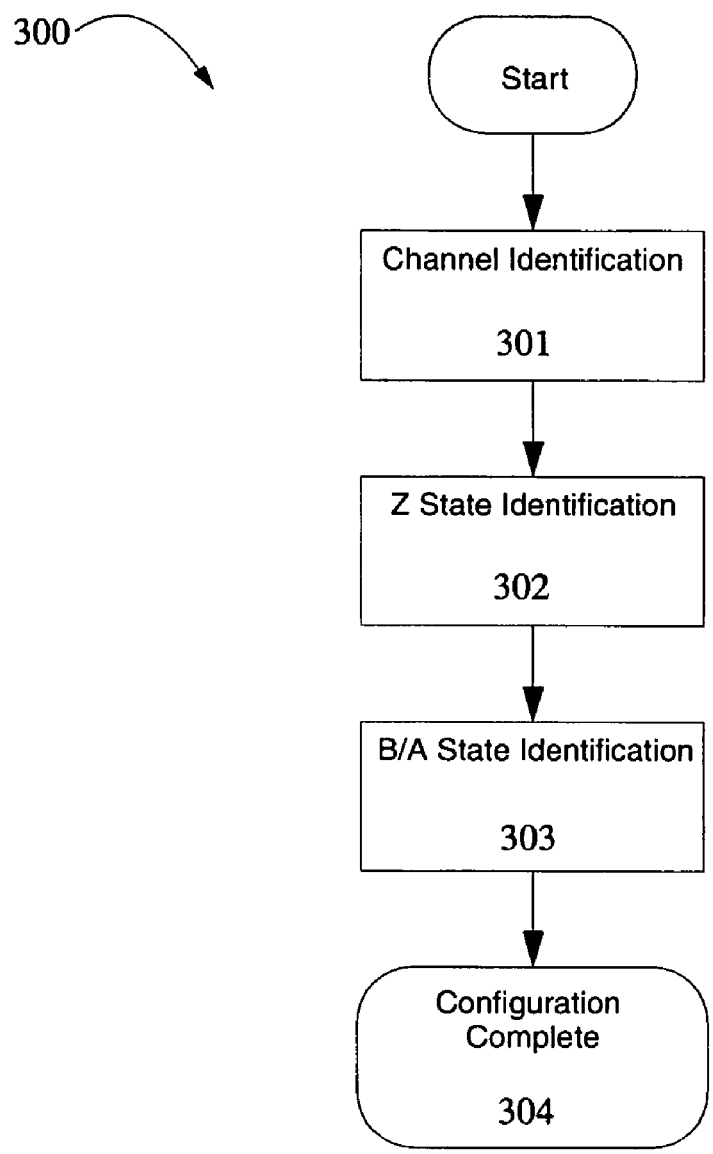
FIG. 3. is a flow chart illustrating an encoder channel discovery process.

When encoder interface device 100 is connected to an unknown encoder, it is configured to automatically discover the encoder channels through a three-phase process 300 illustrated in FIG. 3: channel identification and configuration 301, Z state identification 302, and B/A state identification 303. In one implementation, these identification phases are executed by the controller 103 (shown in FIG. 1) using facilities (e.g., registers, timers, counters, and high-speed logic) of the encoder interface device 100. The result of these phases is a set of configuration data that is written by the controller to the configuration register (register 108 shown in FIG. 1), which modifies the operation of the interface device so that it operates properly and accurately.

In the channel identification and configuration phase 301, the controller 103 determines which of the three input channels is the Z (index) channel, and which are the A and B channels. During this phase, the encoder interface device 100 counts transitions that occur on each of the three encoder channels (A, B, and Z) while the encoder moves for some duration of time. By comparing the number of transitions that occur on each channel, the controller determines that the Z channel is connected to the input channel on which the lowest number of transitions occurred during the duration. After identifying the Z channel, the controller configures the encoder interface device, e.g., by setting bits in the configuration register, to indicate which input channel is the Z channel. Since the input channels of the encoder interface device are configurable, the controller is able to automatically correct Disconnection of the encoder's Z channel to an input channel on the encoder interface device that is designated as the Z channel. For example, if encoder interface device 100 has three input channel ports labeled as "A channel", "B channel", and "Z channel" and a user mistakenly connects the Z channel lead from the encoder into the interface's "A channel" or "B channel" port, the controller will recognize that encoder Z channel is connected to the wrong port and will automatically reconfigure the encoder interface device to use the correct port for the actual Z channel.

In the Z state identification phase, the controller determines whether the active state of the Z channel is high or low. During this phase, the distance traveled (as measured by the position counter, which is controlled by the A/B channels) during each of the two Z channel states is recorded. By monitoring the channel states for a sufficiently long distance (e.g., greater than twice the width of the widest expected index pulse), the controller determines that the active state is the state having the shortest distance, since the index pulse is active for only a small distance (e.g. 1 to 16 encoder counts). Note that the controller can determine the active state even if, during the Z state identification phase, the index pulse is never observed. For example, if the controller observes 100 encoder counts traveled by the encoder when the Z channel is high and does not observe any occurrence of a low Z state, it can infer that the active Z state (if in fact a Z channel is connected) must be low. By automatically determining the active Z channel state, the controller is able to correct misconnections of the Z channel. For example, if an encoder has a positive and negative lead for its Z channel and these leads are respectively connected to negative and positive terminals of the encoder interface device, an index pulse having a high electrical state produced by the encoder will appear as having a low electrical state at the encoder interface. The controller, however, is able to determine during the Z state identification phase that the active Z state as it appears at the encoder interface device is the low electrical state thus effectively correcting the wiring error by the user.

In the B/A state identification phase, the controller determines whether an index pulse exists and if so, measures its characteristics. The controller uses the encoder interface device 100 to monitor the A and B channels while the Z channel is in its active state and determine configuration settings to reliably latch the index position. During the B/A state identification phase, the controller selects a B/A state as the index latch state. The controller also recognizes if the encoder produces a wide index pulse, and if so, configures the encoder interface device to reliably latch the index position regardless of the direction of travel of the encoder.

It should be noted that while the channel identification, Z state identification and B/A state identification phases are shown as sequential processes, other implementations may conduct one or more of these phases in parallel.

Channel Identification

Figure 4:
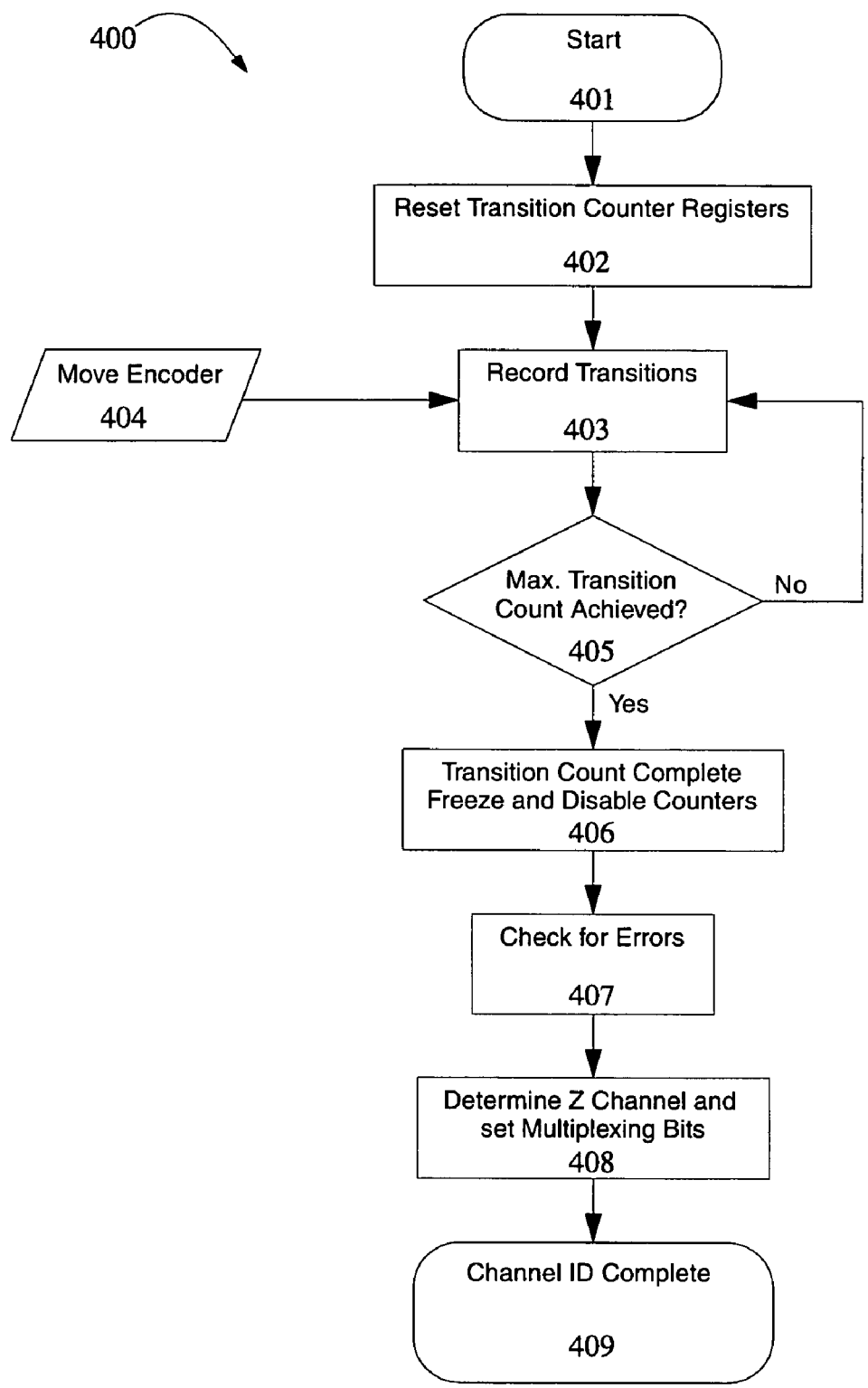
FIG. 4. is a flow chart illustrating a channel identification process.

Referring to FIG. 4, in one implementation, a channel identification process 400 starts with the controller enabling 401 channel identification in the encoder interface device 100 (shown in FIG. 1) by, for example, setting a bit in the control register 107. Enabling channel identification causes the encoder interface device 100 to reset 402 the A, B, and Z channel transition count registers (116, 117, and 118 shown in FIG. 1) to zero; any existing configuration settings are also reset to their default values. The channel transition count registers are internal registers that maintain a transition count for each input channel (i.e., the A, B and Z channel). Data may be passed between the internal channel transition count registers and the controller via an external register, such as the data register 110 shown in FIG. 1.

After the registers are set to zero, the encoder is moved 404 by, for example, manually moving the encoder or using the controller to move the encoder (e.g., by applying a voltage to a motor). As the encoder moves, the encoder interface device records 403 the number of transitions sensed on each channel in the respective transition count registers, and compares 405 each to a predetermined maximum value.

When one of the transition count registers reaches a predetermined maximum value, the controller disables 406 continued counting of transitions in the transition count registers and sets a bit in the status register indicating that the channel transition count is complete. The predetermined maximum value should be set to a value that will ensure proper channel identification (e.g., a value greater than 2). For example, if an encoder interface device is connected to an encoder that produces an output shown in FIG. 2A and the predetermined maximum value is seven, the A channel would be the first to reach seven transitions, which would cause the transition count process to stop. At the end of the process, the A channel would have seven transitions, the B channel would have six and the Z channel would have two.

When the controller observes that the channel transition count is complete (e.g. by reading a status bit value in the encoder interface status register 106 in FIG. 1), it reads the values of all three transition count registers (through the external data register 110 in FIG. 1) and checks 407 the three transition counts for errors. In one implementation, the controller checks to ensure that one of the three values is the predetermined maximum value (e.g., seven), another value is one less than the maximum (e.g., six), and a third value is less than three. If the values do not meet these conditions, the controller is configured to restart the channel identification process 400. Restarting is appropriate to compensate for errors that can be observed when a system is vibrating (oscillating) or moving very slowly, or experiencing high levels of electrical noise. In another implementation, the controller may be configured to terminate encoder channel discovery and inform the user of the error.

Assuming the transition count values satisfy the integrity checks, the controller sets 408 the channel with the smallest transition count as the Z channel since transitions occur infrequently as compared to the A and B channels. Thus, for example, if after a transition count process, one channel has seven transitions, a second channel has zero transitions and the third channel has six transitions, the controller will set the second channel as the Z channel.

Since the input channels of the encoder interface device are configurable, a controller is able to automatically correct connection errors. For example, if an encoder interface device has three input ports labeled (and assumed to be in a default mode) to be the A, B, and Z channel respectively. By counting the transitions that occur on each channel during an encoder discovery phase, the controller is able to sense a Disconnection of the Z channel to the interface encoder and automatically correct the error by, for example, setting a channel multiplexing bit in the configuration register that indicates the proper port for the Z channel. In one implementation, the controller is configured to set at most one of two channel multiplexing bits in the configuration register, the "swap A/Z" bit and "swap B/Z" bit. If the "swap A/Z" bit is set, then the encoder interface device routes the input on the port labeled "A channel" on the encoder interface device to the internal Z channel of the encoder interface device and similarly routes the input on the port labeled "Z channel" to the internal A channel. Similarly, if the "swap B/Z" bit is set, the B and Z inputs are routed to the Z and B internal channels, respectively. If no bits are set, all inputs are routed directly to the corresponding internal channels within the encoder interface device.

Note that if the leads of the encoder's A and B channels are misconnected to the assumed B and A ports, respectively, the only consequence is the direction of counting in the position register is reversed. The controller preferably compensates for this mis-wiring using any known technique such as by subtracting an offset from the raw position value in the position register and multiplying the result by a direction value equal to +1 or −1. The offset may be a value computed with respect to the latched index position read from the index position register and the sign of the direction value may be input from the user. Thus if the index channel is correctly identified and multi-plexed according to configuration settings, the A and B channels will be processed correctly by the interface device to produce a repeatable measurement of distance.

Referring again to FIG. 4, once the controller sets the multiplexing bits (or determines that no multiplexing bits need to be set), the controller ends 409 channel identification by writing a bit in the control register (107 shown in FIG. 1) of the encoder interface device.

Z State Identification Phase

Referring back to FIG. 3, in addition to identifying and configuring the channels, the controller also identifies the active Z state (represented in block 302). In one implementation, the controller determines the active Z state by the process 500 illustrated in FIG. 5.

Figure 5:
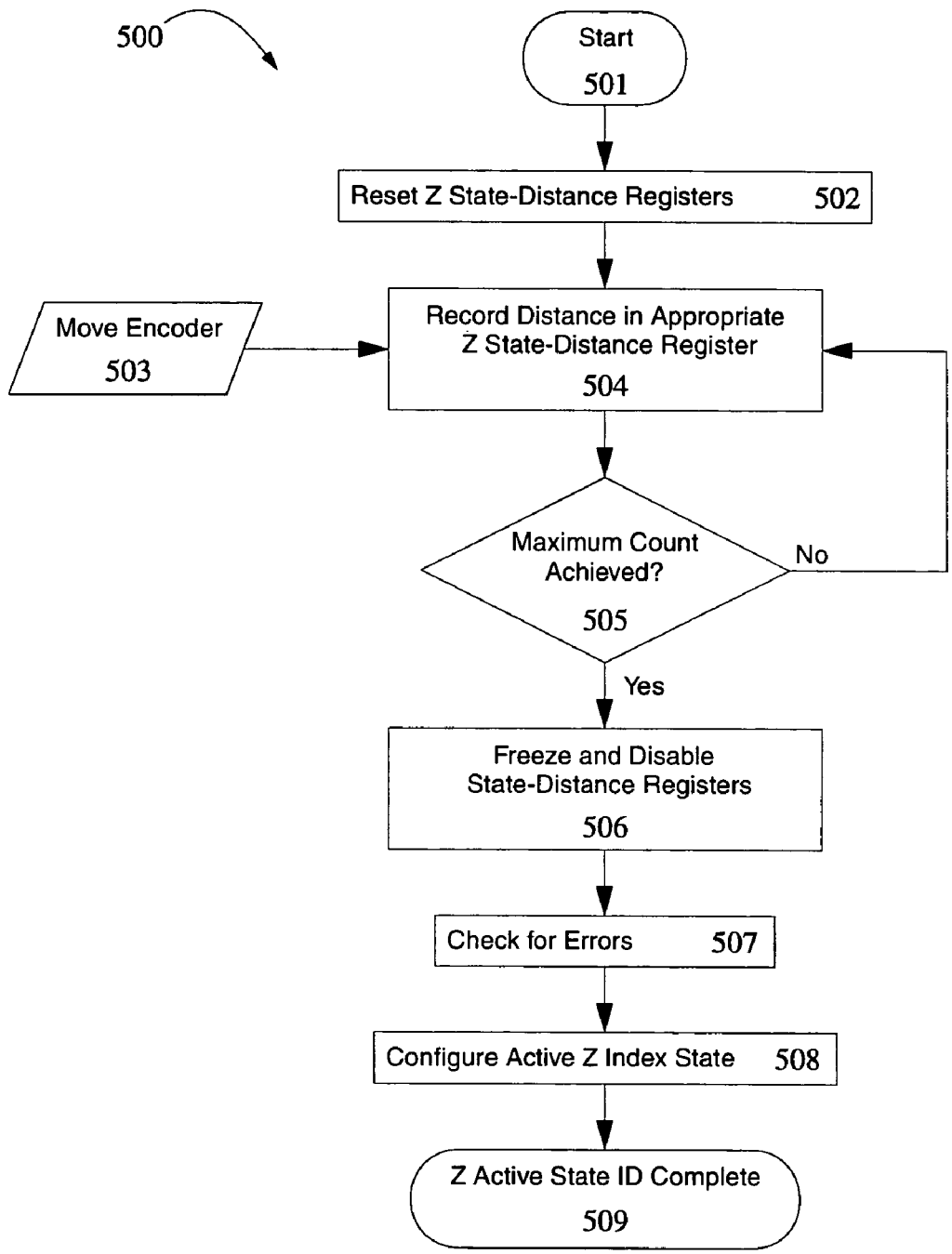
FIG. 5. is a flow chart illustrating a Z state identification process.

As shown in FIG. 5, the active Z state process begins 501 with the controller enabling the active Z state identification process by, for example, setting a bit in the control register of the encoder interface device. This causes the encoder interface device to reset 502 the Z state-distance registers (i.e., the Z low distance register 119 and the Z high distance register 120 shown in FIG. 1) to zero.

Once the Z state-distance registers are set to zero, the encoder is moved 503 by, for example, manually moving the encoder or using the controller to move the encoder. The encoder is preferably moved in a single direction.

As the encoder moves, the encoder interface unit monitors transitions on the A and B channels and records encoder counts 504 in the Z high distance register or the Z low distance register depending on the state of the Z channel.

Encoder counts are recorded in the Z state registers in the same way that they are in the position counter where B/A state changes occurring in one order (e.g., changes from 0 to 1, 1 to 3, 3 to 2, or 2 to 0) indicate travel in a forward direction and result in an increment of the Z state distance register, and B/A state changes occurring in the opposite order (e.g., changes from 1 to 0, 3 to 1, 2 to 3, or 0 to 2) indicate travel in the reverse direction and result in a decrement of the Z state register. Encoder counts are recorded in either the Z high distance register or the Z low distance register depending on whether the Z state is high or low. In particular, if an A or B channel transition is sensed when the Z state is low, the resulting encoder count is recorded in the Z low distance register (by incrementing or decrementing the current value of the register). Similarly, if an A or B channel transition is sensed when the Z state is high, then the resulting encoder count is recorded in the Z high distance register. Thus the Z state distance registers capture the distance traveled by the encoder during each Z state for any given period of time.

Encoder counts are recorded in the appropriate Z state distance registers until the absolute value of one of the Z state distance registers reaches a predetermined maximum value (block 505).

When one of the state-distance registers has reached the maximum absolute value, the encoder interface disables 506 the operation of the Z state distance registers, and indicates that the state distance counts are complete (e.g., by setting a bit in the encoder interface status register 106 in FIG. 1). The predetermined maximum value is preferably set to a value that will allow proper active index state identification with a wide index pulse. In some implementations, the predetermined maximum value is configurable by a user. In one implementation a value of 40 is used, thus, when one of the Z state distance registers reaches a value of 40 or −40, the Z state distance capture is terminated.

When the controller observes that Z state distance capture is complete (e.g. by reading a status bit value in the encoder interface status register 106 in FIG. 1), it reads the values of both Z state distance registers (via an external register such as the data register 110 in FIG. 1) and checks 507 the high-distance and low-distance values for errors. In one implementation, the controller checks that the larger distance is equal to the predetermined maximum value (e.g. absolute value of 40) and checks that the smaller distance is less than half the larger distance. In one implementation, the controller restarts Z state identification if its integrity conditions are not met.

Assuming the state-distance values meet the integrity conditions, the controller deduces that the active index state is the one corresponding to the smaller absolute value of the state distance values and writes 508 the value of the active index state to the Z portion (e.g., the first bit of a three-bit field) of the "Z/B/A latch state" configuration value, to enable the encoder interface device to identify when the index active state is entered.

Once the controller has determined the active index state, the controller disables 509 Z state identification by, for example, writing a bit in the control register (107 in FIG. 1) of the encoder interface device.

To further illustrate the active Z state identification process described above, consider a controller and an encoder interface device connected to an encoder that produces an output shown in FIG. 2B when the encoder is moved. If the distance used to terminate the accumulation of counts in the Z state distance registers is set to 40 and the encoder moves in the negative direction, the Z state distance capture will terminate when the low-distance count equals −40, at which time the high-distance count will equal −4. The controller will record the Z active state as high in the configuration register of the encoder interface device.

B/A State Identification

Referring again to FIG. 3, in addition to identifying and configuring (e.g., setting the multiplexing bits) the channels (block 301) and determining the active Z state (block 302), the controller also identifies the B/A index latch states of the encoder (block 303). In one implementation, the controller uses the encoder interface device 100 to determine the B/A states by the process 600 illustrated in FIG. 6.

Figure 6:
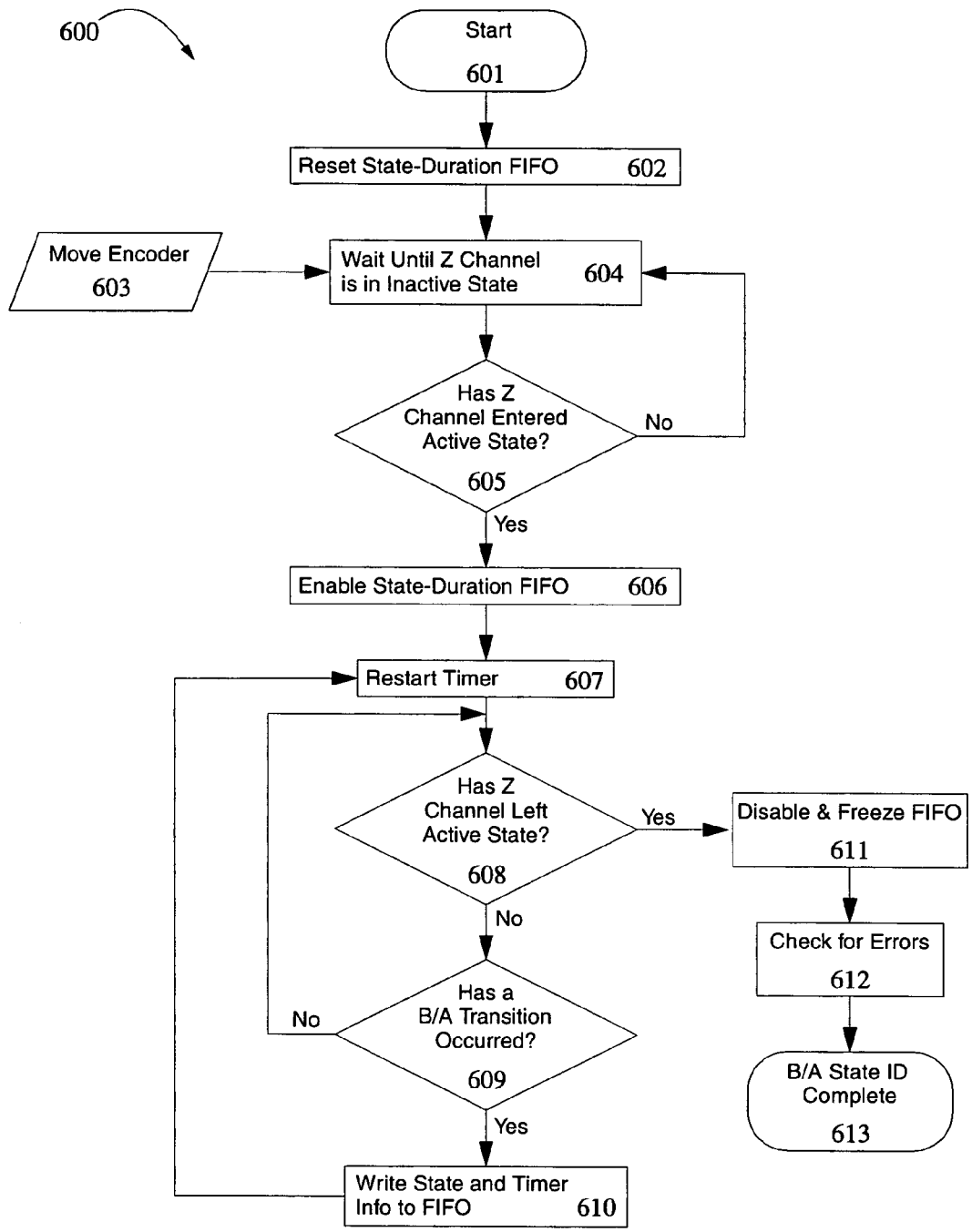
FIG. 6. is a flow chart illustrating a B/A state identification process.

As shown in FIG. 6, a B/A state identification process 600 executed by the controller using the encoder interface device begins with the controller enabling 601 the B/A state identification by, for example, setting a bit in the control register of the encoder interface device. This clears 602 the state-duration FIFO buffer 121 (shown in FIG. 1).

Once the state-duration FIFO buffer is cleared, the encoder is moved 603 by, for example, manually moving the encoder or using the controller to move the encoder. The encoder is preferably moved in a single direction.

As the encoder moves, the encoder interface device waits 604 until the Z channel is not in the active state to ensure that the entire active index pulse is recorded. When the encoder interface device senses 605 that the Z channel has entered the active state, it enables 606 the FIFO buffer.

The encoder interface device also resets 607 the high-resolution timer/counter to zero and begins counting.

The state of the Z channel is monitored 608 continuously, and as long as it remains in the active state, the A and B channels are monitored 609 for transitions. When a B or A transition occurs, a state/duration element is recorded 610 in the FIFO buffer. The state/duration element preferably includes the identity of the B/A state before the transition occurred and the value of the timer at the transition. The value of the timer serves as a measurement of the duration of time of that B/A state, which may be used to aid in selecting a Z/B/A latch state. The timer is reset 607 again to begin timing the duration of the next B/A state. (If the active Z state is not sensed after some predetermined amount of time has elapsed or a predetermined minimum distance has been traveled (as indicated by the position register 104 shown in FIG. 1), the controller may conclude that no index channel is connected. In this case, the controller interrupts the state identification process and the encoder channel discovery process is complete.)

Assuming that the encoder interface device observes the active Z state, it ends 611 B/A state identification, and disables operation and preserves the values of the state-duration FIFO buffer, when it observes that the Z channel has changed to the inactive state. The encoder interface device may indicate the end of the B/A state identification process, for example, by setting a bit in the status register (106 shown in FIG. 1).

When the controller observes that the B/A state identification process has ended (e.g. by reading a status bit value in the encoder interface status register 106 in FIG. 1), the controller reads the FIFO buffer entries (via an external register such as the data register 110 in FIG. 1) and checks 612 for errors. In one implementation, the controller checks the sequence of states to ensure there were no direction reversals, duplicate consecutive states, or invalid transitions (e.g., from B/A state 0 to state 3). The controller may also check to ensure that the durations of the recorded B/A states do not equal zero or a predetermined overflow value (e.g., a maximum time value that is able to be stored in the high-resolution timer/counter). If the controller determines an error, it may restart the B/A state identification process, terminate the process, or take other appropriate error response actions.

Assuming that the list of state-duration entries in the FIFO buffer satisfy the integrity checks, the controller in one particular implementation selects a B/A index latch state according to the following set of rules:

1. If there is only one entry in the list, the controller selects the state corresponding to that entry as the B/A latch state.

2. If there are two entries in the list, the controller selects the state having the longer duration.

3. If there are three to seven entries on the list, the controller selects the state of the middle-most entry. For example, the controller will select the fourth entry in a list of six or seven elements, the third entry in a list of four or five elements, the second entry in list of three elements. Since the list has previously been validated to have a state sequence corresponding to continuous positive or negative rotation, this entry is assured to exist only once on the list.

4. If there are more than seven entries, the controller sets a "is-wide-index" flag bit in the configuration register (108 shown in FIG. 1) of the encoder interface device indicating that the controller has a wide index pulse. In one particular implementation, the controller is programmed to use the B/A state contained in the second entry on the list to ensure that a state at the edge of the active index region will not be used. Other implementations may select other B/A states on the list, however it is usually preferable to avoid selection of the first or last B/A state on the list since these states occur during Z state transitions and may be subject to more variability than an interior state. In one implementation, the controller also sets another flag bit (called the "use-first-positive" bit) in the configuration register if the direction of encoder travel represented in the state-duration list is positive. The use-first-positive bit is set to zero if the direction is negative. This ensures that the B/A state selected as the latch state will be properly latched regardless of encoder travel direction, as will be explained in more detail below.

To further illustrate the B/A state selection process, consider a controller and an encoder interface device connected to encoders that respectively produce an output shown in FIGS. 2A–2C when the respective encoder is moved. At the completion of a B/A state identification process run on each encoder, the FIFO buffer may have the following information:

For the encoder shown in FIG. 2A:

| B/A State | Duration |
|---|---|
| 0 | 24 |
| 1 | 945 |

In one implementation, B/A state 1 is chosen, since it has the longest duration. For the encoder shown in FIG. 2B:

| B/A State | Duration |
|---|---|
| 2 | 17 |
| 0 | 1161 |
| 1 | 1058 |
| 3 | 1004 |
| 2 | 956 |

In one implementation, the middle-most recorded state, B/A state 1, is selected as the B/A portion of the Z/B/A latch state.

For the encoder shown in FIG. 2C:

| B/A State | Duration |
|---|---|
| 2 | 63 |
| 0 | 1161 |
| 1 | 1058 |
| 3 | 1004 |
| 2 | 1105 |
| 0 | 1112 |
| 1 | 1093 |
| 3 | 1057 |
| 2 | 824 |

In one implementation, the second state in the list, B/A state 0, is selected by the controller. Since the direction on the list, indicated by the sequence 2, 0, 1, 3, 2, etc., is positive, the "use-first-positive" flag bit is set, and since the list has more than seven entries, the "is-wide-index" flag bit is set, in the configuration register of the encoder interface device.

Once the configuration choices are determined, their values are recorded by the controller for future use, and written to the configuration register (108 shown in FIG. 1) of the encoder interface device.

Operation

Figure 7:
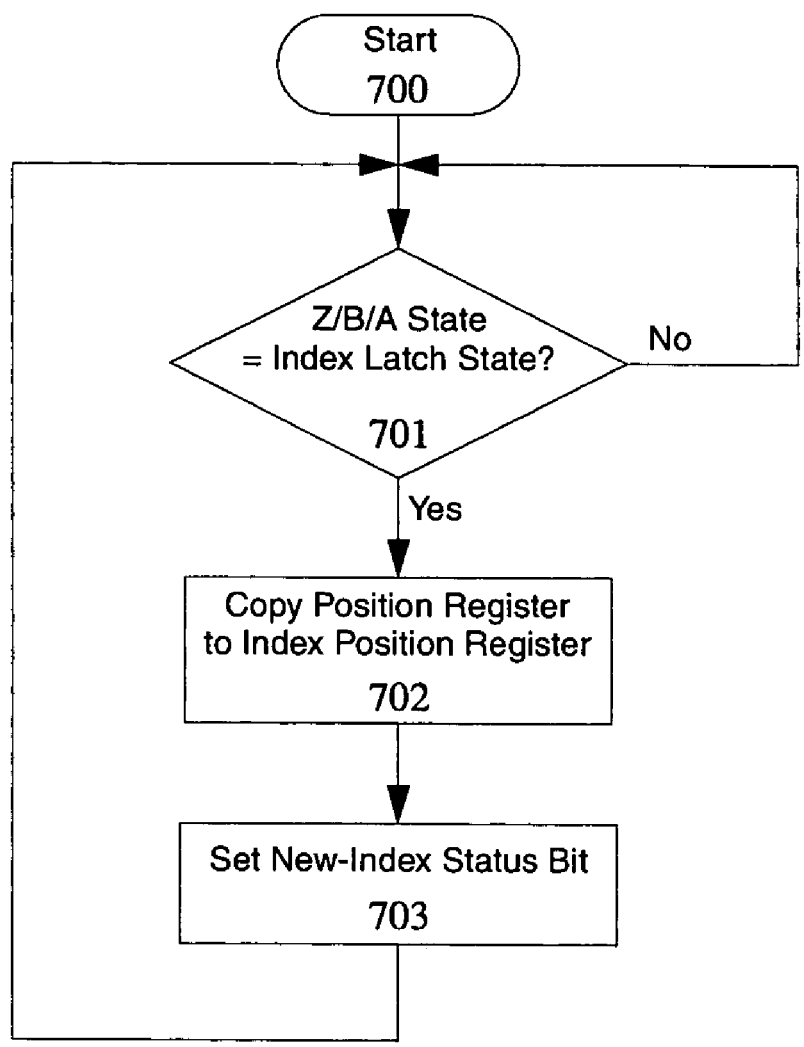
FIG. 7. is a flow chart illustrating a process of index position determination for a non-wide index pulse.

Once the configuration process is complete, a controller can utilize the encoder interface device to reliably latch the index position, even in the case of an encoder having a wide index pulse. For example, as shown in FIG. 7, the operation of an encoder interface device that has been configured to latch the occurrence of a non-wide index pulse is illustrated. In one implementation, the encoder interface device starts 700 the non-wide index latch operation if the "is-wide-index" bit in the configuration register (108 shown in FIG. 1) is not set. The encoder interface device compares 701 the input on the Z, B, and A input channels to the Z/B/A latch state stored in the configuration register. When the input on the Z, B, and A channels matches the Z/B/A latch state, the index position is latched 702 by, for example, copying the value of the position register (104 shown in FIG. 1) to the index position register (109 shown in FIG. 1) and setting 703 the new-index status bit in the status register (106 shown in FIG. 1). This process repeats until the encoder interface device is reconfigured for a new encoder.

Figure 8:
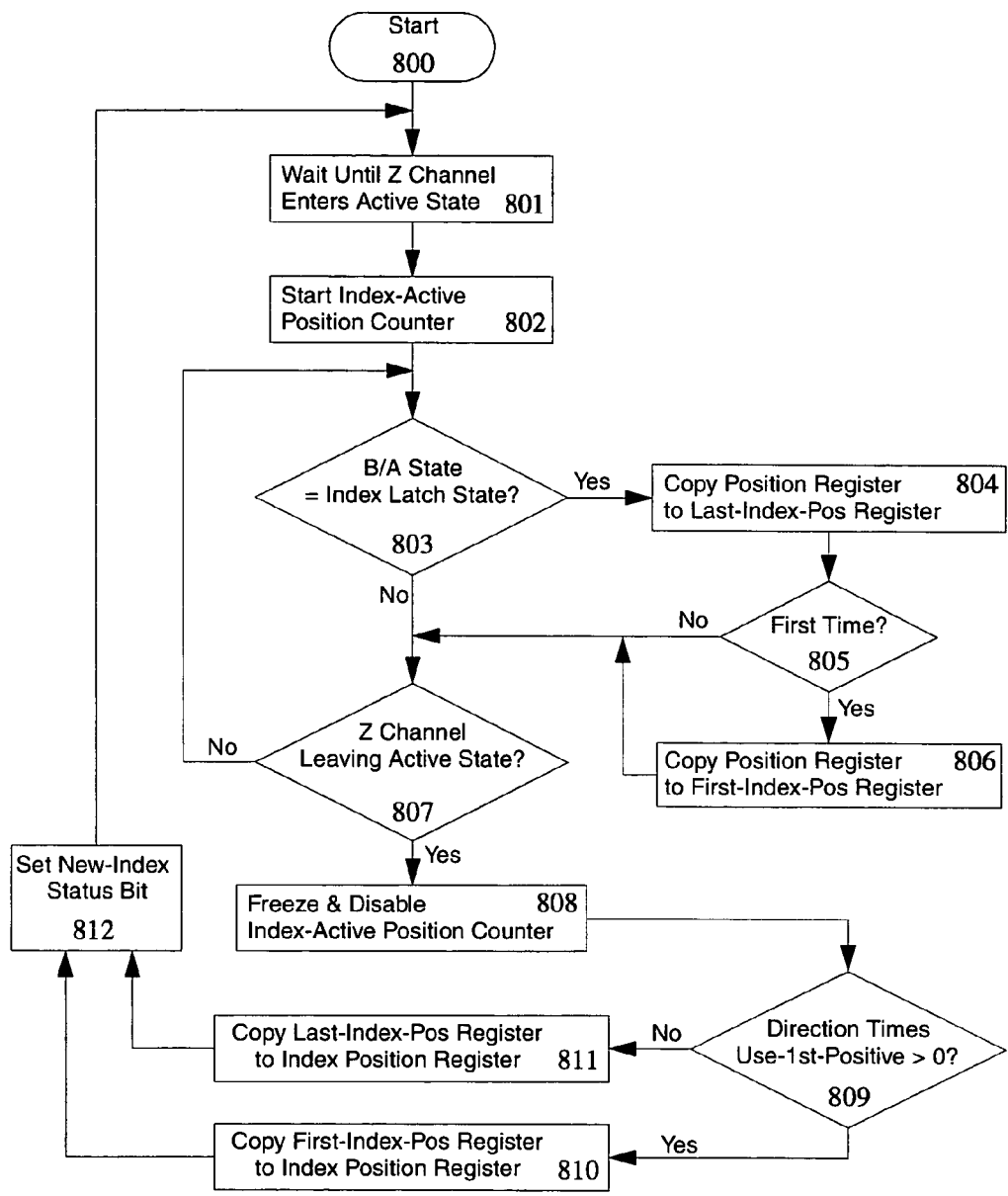
FIG. 8. is a flow chart illustrating a process of index position determination for a wide index pulse.

As shown in FIG. 8, the operation of an encoder interface device that has been configured to latch the occurrence of a wide index pulse is illustrated. In one implementation, the encoder interface device starts 800 the wide-index latch operation if the "is-wide-index" bit in the configuration register (108 shown in FIG. 1) is set. The encoder interface device monitors 801 the Z channel input to sense when it enters its active state. In one implementation, the encoder interface device determines when the Z channel enters its active state by comparing the Z channel input to the Z value of the Z/B/A latch state stored in the configuration register.

When the encoder interface device senses a transition on the Z channel to its active state, the encoder interface device starts 802 the index active distance counter (122 shown in FIG. 1) that records the difference between the position register value when the index active state was entered and when it became inactive. This register effectively records the width (in encoder counts) of the index pulse, except that its value can be negative if the encoder traveled through the index pulse in the negative direction.

When the Z channel enters its active state, the encoder interface device also compares 803 the state of the A and B channel inputs with the value of the B/A latch state (i.e., the B/A value of the Z/B/A latch state). If the values are not equal, the Z channel is checked 807 to detect if the active index state is terminating. If the active Z index state is not terminating, the encoder interface device checks the B/A latch state and the process is repeated.

When the B/A state equals the B/A latch state during the active state of the Z channel, the position register is latched 804 to an internal register known as the "last index position register" (115 shown in FIG. 1). When this happens, the encoder interface device also checks 805 to see if a position has been previously latched while the current index pulse has been active. If not, the position is also latched 806 to another internal register known as the "first index position register" (114 shown in FIG. 1) and the encoder interface device continues to monitor the Z, B, and A channels (blocks 803–807).

When the Z channel changes from the active to the inactive state, the encoder interface device stops 808 the index active position counter and checks 809 the value of the "use-first-positive" binary choice flag in the configuration register. The encoder interface device then selects the position recorded in either the first-index-position register or the last-index-position register as the index latch position depending on the direction of encoder travel and the configuration settings of the encoder interface device. In one implementation, the encoder interface device selects the index latch position by making a logical computation of the "use-first-positive" bit of the configuration register and the index active position counter. In particular, if the "use-first-positive" bit is set AND the index active position counter is positive, OR if the "use-first-positive" bit is not set AND the index active position counter is negative, then the encoder interface device latches 810 the value in the "first index position register" to the index position register; otherwise the "last index position register" is latched 811 to the index position register. The logical computation can alternately be computed as the negation of the exclusive-or operation between the "use-first-positive" and "is-positive-direction" binary values.

In another implementation, the encoder interface device selects the index latch state by setting a "use-first-sign" variable equal to +1 if the "use-first-positive" is set, and equal to −1 if it is not set, and setting a "direction-sign" variable equal to +1 if the "index active position counter" has a value greater than zero, and to −1 if it has a value less than zero. If the product of the use-first-sign and the direction-sign is greater than zero, the "first index position register" is latched (copied) to the index position register; if less than zero, the "last index position register" is latched to the index position register.

When the encoder interface device latches a value to the index position register, it also sets 812 a new-index status bit in the index register to indicate to the controller that the index position has been latched and that a new position can be read in the index position register.

The encoder interface device continues to monitor the Z channel 801 for the next index pulse.

In one implementation the encoder interface device 100 also checks the integrity of the latched index position by comparing the absolute value of the width of the index pulse (as measured in the index active position counter) with some predetermined number of encoder counts, e.g., three encoder counts, that would indicate that the moving element changed directions during the active period of the index pulse. If the absolute value of the index pulse is less than the predetermined value, then the encoder interface device 100 assumes that the encoder reversed direction while the index pulse was active and does not latch an index position during the index pulse. Otherwise the encoder interface device assumes that the encoder did not change directions and latches an index position value.

By monitoring the B/A states and tracking encoder direction during a wide index pulse, the same position encoder count value is reliably and repeatably captured as the latched index position, regardless of the direction of encoder movement and regardless of index pulse width.

A number of implementations of the invention have been described. Nevertheless, it will be understood that various modifications may be made without departing from the spirit and scope of the invention. For example, portions of the above algorithms can be executed either on the encoder interface device or the controller. To illustrate this, the determination of index pulse width and encoder direction might be made by logic within the encoder interface device instead of by examination of a state-duration list. In this case, index pulse width and/or encoder direction could be communicated to the controller by means of bits in a status register. Although each step of encoder channel discovery involves inducing motion in the encoder, that motion can be induced in many different ways. For example, motion could be induced before channel discovery has even begun, and the motion could suffice to accomplish all three identification steps without further stimulus. The motion might be induced with other goals to accomplish and for additional reasons, besides encoder channel discovery. For example, the controller may impose a series of voltage steps on the windings of a motor attached to the encoder, for the purpose of estimating electrical and/or mechanical properties or parameters of the motor and motion system, and these voltage steps might serve the purpose of inducing motion to enable encoder discovery.

During the channel identification process of encoder channel discovery, all three input channels are monitored for transitions in implementations described above. In another implementation, however, only two channels need to be monitored. If both channels have a large and substantially equal number of transitions, the two channels can be inferred to be the A and B channels; if not, the channel with the fewer number of transitions can be inferred to be the Z channel.

In implementations described above, three sequential processes are described: channel identification, Z (active index) state identification, and B/A (index latch) state identification. In other implementations, however, one or more of these processes can be combined or else performed in parallel. For example, a combined channel and Z state identification could be performed by counting transitions on each channel as well as counting the number of times each high or low state is seen at the time of a transition. Then the Z channel can be deduced as the one having the fewest transitions, and the active state as the state having the fewest recorded occurrences of that state. A combined Z state and B/A state identification could be performed by keeping a B/A state-duration FIFO buffer for the Z low state and another one for the Z high state. The active Z state can be deduced to be the one whose corresponding FIFO has the fewest entries, and the entries in this FIFO buffer are further analyzed as described above to determine the B/A latch state. All three processes can be combined by providing and analyzing a FIFO buffer that records a sequence of each Z/B/A state and, optionally, its duration. Such a list of states can be analyzed to determine which channel has the fewest transitions, and within that channel, which state occurs less often, and finally, during that less frequent state, which states on the other channels are appropriate for latching the index position.

The process of B/A state identification could also be performed without making use of duration information. In an implementation described above, the duration of the B/A state is used to determine the index latch state only when the number of states in the FIFO buffer equals two. For this case (when the list has two states), one state could be picked arbitrarily. Alternatively, the test could be repeated several times, and optionally in both positive and negative directions, and the state whose occurrence is more consistently present during each test could be selected as the B/A latch state.

Although the encoder described thus far provides digital input channels, the techniques described above can be applied to an encoder that provides continuous analog channels, by converting the input to digital form via any of several means known in the art, for the purpose of performing encoder channel discovery and wide index pulse support.

The techniques described above can also be used with encoders that provide multi-function multiplexed channels, by first ensuring that the encoders are configured to provide digital or analog A, B, and Z channels.

It should be understood that this disclosure is not limited to discovery of the Z channel, the active state of the Z channel, and B/A states during the active state of the Z channel, and may be applied to discover other characteristics of an unknown encoder, for example, differential matching pair connections (i.e., for an encoder providing differential channel signals, which terminal is A+ and which is A−, which terminal is B+and which is B−, and which terminal is Z+ and which is Z−). Differential matching pair connections could be discovered by monitoring waveforms on all six signal terminals (A+, A−, B+, B−, Z+, and Z−), finding a terminal whose waveform over time matches most closely the inverse waveform of another terminal (thus identifying the two terminals that form a differential pair) and assigning or routing the pair of terminals to a differential input processing element that forms an input channel or terminal in the encoder interface device.

Accordingly, other embodiments are within the scope of the following claims.

What is claimed is:

1. A method for determining which of three of channels output by an incremental encoder is an index channel, the three channels including an A channel, a B channel, and the index channel, the method comprising:

connecting the three channels of the incremental encoder to an encoder interface device;

moving the encoder;

monitoring some or all of the connected channels with the encoder interface device to detect a number of transitions that occur on at least two of the channels as the encoder is moved; and identifying which of the three channels is the index channel of the encoder based on the number of transitions detected by the encoder interface device.

2. The method of claim 1 wherein identifying which of the three channels is the index channel comprises:

identifying which of the channels had the smallest number of transitions detected as the encoder was moved.

3. The method of claim 1 further comprising:

monitoring the three channels with the encoder interface device to detect a number of transitions that occur on each of the three channels as the encoder is moved.

4. The method of claim 3 further comprising:

identifying which of the channels had the smallest number of transitions detected as the encoder was moved.

5. The method of claim 1 wherein monitoring some or all of the connected channels with the encoder interface device to detect a number of transitions that occur on at least two of the channels as the encoder is moved comprises:

recording a number of transitions that occur on each of at least two channels as the encoder is moved.

6. The method of claim 1 wherein two of the connected channels are monitored to detect a number of transitions that occur on two of the channels and wherein identifying which of the three channels is the index channel of the encoder based on the number of transitions detected by the encoder interface device comprises:

selecting the unmonitored channel as the index channel if approximately the same number of transitions are detected on the two monitored channels.

7. The method of claim 6 further comprising:

selecting the monitored channel having the smallest number of detected transitions as the index channel if approximately the same number of transitions are not detected on the two monitored channels.

8. The method of claim 1 wherein monitoring a number of transitions comprises:

monitoring a number of transitions that occur on at least two of the plurality of channels until a predetermined number of transitions has been detected on at least one of the monitored channels.

9. The method of claim 1 wherein the encoder interface device further comprises a plurality of terminals, each terminal adapted to be electrically connected to one of the plurality of channels, the method further comprising:

configuring the encoder interface device to associate one of the terminals with the identified index channel, and the other terminals with the A and B channels.

10. The method of claim 1 wherein the encoder interface device comprises a plurality of registers, and wherein monitoring the number of transitions comprises:

for each of a plurality of channels, storing in a register a number of transitions detected on the channel as the encoder is moved.

11. The method of claim 1 wherein the encoder interface device is integrated within a controller.

12. The method of claim 1 wherein the encoder interface device is external to a controller.

13. The method of claim 1, wherein the index channel has a first state and a second state, the method further comprising:

monitoring the encoder channels to determine a distance traveled by the encoder in the first state of the index channel as the encoder is moved; and determining which of the first or second state of the index channel is an active state based on the determined distance.

14. The method of claim 13 further comprising:

monitoring the encoder channels to determine a distance traveled by the encoder in the second state of the index channel as the encoder is moved.

15. The method of claim 14 wherein determining which of the first or second state of the index channel is an active state is also based on the monitored distance traveled by the encoder in the second state.

16. The method of claim 14 wherein monitoring the encoder channels to determine a distance traveled by the encoder in a first state and monitoring the encoder channels to determine a distance traveled by the encoder in a second state occur at the same time.

17. The method of claim 14 wherein monitoring the encoder channels to determine a distance traveled by the encoder in a first state comprises:

recording in a first register a number of encoder counts sensed on the A and B channels in the first index state as the encoder is moved.

18. The method of claim 17 wherein monitoring the encoder channels to determine a distance traveled by the encoder in a second state comprises:

recording in a second register a number of encoder counts sensed on the A and B channels in the second index state as the encoder is moved.

19. The method of claim 14 wherein determining which of the first or second state of the index channel is an active state comprises:

selecting the index active state as the state in which the encoder traveled the smallest distance as the encoder is moved.

20. The method of claim 1 further comprising:

monitoring the three channels using the encoder interface device as the encoder is moved over a distance sufficient to cause generation of at least one index active state pulse on the index channel;

determining each combined state of the A and B channels detected during an index active state pulse; and selecting one of the determined combined states of the A and B channels as an index latch state.

21. The method of claim 20 wherein selecting one of the determined combined states comprises:

selecting a combined state of the A and B channels other than a first and a last combined state of the A and B channels detected during the index active state pulse.

22. The method of claim 20 further comprising:

determining if every detected combined state of the A and B channels is detected at least twice during the index active state pulse.

23. The method of claim 22 further comprising:

in response to determining that every detected combined state of the A and B channels is detected at least twice, setting a bit in a configuration register of the encoder interface device to indicate a wide index pulse.

24. The method of claim 23 further comprising:

setting a bit in a configuration register of the encoder interface device to indicate a direction of encoder travel with which to control selection of a latched index position from a plurality of recorded positions.

25. The method of claim 14 further comprising:

monitoring the three channels using the encoder interface device as the encoder is moved over a distance sufficient to cause generation of at least one index active state pulse on the index channel;

determining each combined state of the A and B channels detected during an index active state pulse; and selecting one of the determined combined states of the A and B channels as an index latch state.

26. The method of claim 25 wherein selecting one of the determined combined states comprises:
   selecting a combined state of the A and B channels other than a first and a last combined state of the A and B channels detected during the index active state pulse.

27. The method of claim 25 further comprising:
   determining if every detected combined state of the A and B channels is detected at least twice during the index active state pulse.

28. The method of claim 27 further comprising:
   in response to determining that every detected combined state of the A and B channels is detected at least twice, setting a bit in a configuration register of the encoder interface device to indicate a wide index pulse.

29. A method for determining an active state of an index channel of an incremental encoder device having three channels including an A channel, a B channel, and an index channel, wherein the index channel has a first and second state, the method comprising:
   connecting the three channels of the incremental encoder to an encoder interface device;
   monitoring the channels with the encoder interface device to determine a distance traveled by the incremental encoder during a first state of the index channel as the encoder is moved; and
   determining which of the first or second state of the index channel is an active state based on the determined distance.

30. The method of claim 29 further comprising:
   monitoring the encoder channels to determine a distance traveled by the encoder in the second state of the index channel as the encoder is moved.

31. The method of claim 30 wherein determining which of the first or second state of the index channel is an active state is also based on the monitored distance traveled by the encoder in the second state.

32. The method of claim 30 wherein monitoring the encoder channels to determine a distance traveled by the encoder in a first state and monitoring the encoder channels to determine a distance traveled by the encoder in a second state occur at the same time.

33. The method of claim 30 wherein monitoring the encoder channels to determine a distance traveled by the encoder in a first state comprises:
   recording in a first register a number of encoder counts sensed on the A and B channels in the first index state as the encoder is moved.

34. The method of claim 33 wherein monitoring the encoder channels to determine a distance traveled by the encoder in a second state comprises:
   recording in a second register a number of encoder counts sensed on the A and B channels in the second index state as the encoder is moved.

35. The method of claim 30 wherein determining which of the first or second state of the index channel is an active state comprises:
   selecting the index active state as the state in which the encoder traveled the smallest distance as the encoder is moved.

36. The method of claim 29 wherein the encoder interface device is integrated within a controller device.

37. The method of claim 29 wherein the encoder interface device is external to a controller device.

38. The method of claim 29 further comprising setting a bit in a configuration register associated with the encoder interface device indicating the determined active state of the index channel.

39. The method of claim 29 further comprising:
   monitoring the three channels using the encoder interface device as the encoder is moved over a distance sufficient to cause generation of at least one index active state pulse on the index channel;
   determining each combined state of the A and B channels detected during an index active state pulse; and
   selecting one of the determined combined states of the A and B channels as an index latch state.

40. The method of claim 39 wherein selecting one of the determined combined states comprises:
   selecting a combined state of the A and B channels other than a first and a last combined state of the A and B channels detected during the index active state pulse.

41. The method of claim 39 further comprising:
   determining if every detected combined state of the A and B channels is detected at least twice during the index active state pulse.

42. The method of claim 41 further comprising:
   in response to determining that every detected combined state of the A and B channels is detected at least twice, setting a bit in a configuration register of the encoder interface device to indicate a wide index pulse.

43. A method for selecting an index latch state for an incremental encoder having three channels including an A channel, a B channel, and an index channel, the method comprising:
   moving the encoder over a distance sufficient to cause the generation of at least one index pulse on the index channel;
   monitoring the channels of the incremental encoder with the encoder interface device as the encoder is moved to detect one or more combined states of the A and B channels occurring while the index channel is in an active state; and
   selecting one of the determined combined states of the A and B channels as an index latch state.

44. The method of claim 43 wherein monitoring the channels comprises:
   detecting each combined state of the A and B channels occurring while the index channel is in an active state.

45. The method of claim 43 wherein selecting one of the determined combined states comprises:
   selecting a combined state of the A and B channels other than a first and a last combined state of the A and B channels detected when the index channel is in an active state.

46. The method of claim 43 further comprising:
   determining if every detected combined state of the A and B channels is detected at least twice during the index active state pulse.

47. The method of claim 43 further comprising:
   in response to determining that every detected combined state of the A and B channels is detected at least twice, setting a bit in a configuration register of the encoder interface device to indicate a wide index pulse.

48. The method of claim 43 wherein the encoder interface device is integrated within a controller.

49. The method of claim 43 wherein the encoder interface device is external to a controller device.

50. A method for determining an index position of an incremental encoder having three channels including an A channel, a B channel and an index channel and wherein the incremental encoder is configured to produce a wide index pulse, the method comprising:

sensing when the index channel enters an active state;

recording a first encoder position when a predetermined combined state of the A and B channels is detected after the index pulse enters the active state;

recording a second encoder position when the predetermined combined state of the A and B channels is detected for a second time after the index pulse enters the active state; and selecting the first or second recorded position as the index position based on the direction of encoder travel.

51. The method of claim 50 wherein recording a first encoder position comprises:

recording a first encoder position when a predetermined combined state of the A and B channels is sensed for a first time after the index pulse enters the active state.

52. The method of claim 51 wherein recording a second encoder position comprises:

recording a second encoder position each time a predetermined combined state of the A and B channels is sensed while the index pulse is in the active state.

53. The method of claim 50 further comprising:

recording a distance traveled by the encoder while the index pulse is active.

54. The method of claim 53 wherein selecting the first or second recorded position as the index position based on direction of encoder travel comprises:

using the recorded distance traveled by the encoder to determine a direction of encoder travel.

55. The method of claim 53 wherein recording the distance traveled comprises:

recording encoder counts sensed during the active state of the index pulse in a register.

56. The method of claim 53 further comprising:

verifying that the encoder has not changed directions during the active state of the index pulse.

57. The method of claim 56 wherein verifying that the encoder has not changed direction comprises:

verifying that the recorded distance traveled by the encoder while the index pulse is active is greater than a predetermined distance.

58. The method of claim 52 wherein selecting the first or second recorded position is also based on a predetermined selection of a direction of encoder travel.

* * * * *